United States Patent
Hughes et al.

(10) Patent No.: US 9,077,335 B2
(45) Date of Patent: Jul. 7, 2015

(54) REDUCTION OF THE INDUCTANCE OF POWER LOOP AND GATE LOOP IN A HALF-BRIDGE CONVERTER WITH VERTICAL CURRENT LOOPS

(71) Applicant: HRL Laboratories, LLC, Malibu, CA (US)

(72) Inventors: Brian Hughes, Woodland Hills, CA (US); Karim S. Boutros, Moorpark, CA (US); Daniel M. Zehnder, Los Angeles, CA (US); Sameh G. Khalil, Calabasas, CA (US); Rongming Chu, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/065,715

(22) Filed: Oct. 29, 2013

(65) Prior Publication Data

US 2015/0116022 A1 Apr. 30, 2015

(51) Int. Cl.
*H03K 17/04* (2006.01)
*H03K 17/041* (2006.01)
(52) U.S. Cl.
CPC ................................. *H03K 17/04106* (2013.01)
(58) Field of Classification Search
USPC .............................. 327/92, 365–508, 587, 588
See application file for complete search history.

(56) References Cited

U.S. PATENT DOCUMENTS

| | | | |
|---|---|---|---|
| 6,934,166 B2* | 8/2005 | Vinciarelli | 363/17 |
| 6,984,965 B2* | 1/2006 | Vinciarelli | 323/266 |
| 2005/0286271 A1* | 12/2005 | Vinciarelli | 363/17 |
| 2006/0290689 A1 | 12/2006 | Grant et al. | |
| 2010/0246214 A1* | 9/2010 | Nakahori | 363/17 |

FOREIGN PATENT DOCUMENTS

JP 2006-319191 11/2006

OTHER PUBLICATIONS

FSFR Series-Power Switch Datasheet (Fairchild Semiconductor) pp. 1-18; Jun. 2010.
General Considerations for IGBT and Intelligent Power Modules (Mitsubishi Semiconductors Power Modules MOS) Sep. 1998.
International Search Report and Written Opinion from PCT/US2014/055020.

* cited by examiner

*Primary Examiner* — Brandon S Cole
(74) *Attorney, Agent, or Firm* — Ladas & Parry

(57) ABSTRACT

A half bridge circuit including an isolation substrate, a metal layer on one surface of the isolation substrate, a power loop substrate on the metal layer, an upper switch on the power loop substrate, a lower switch on the power loop substrate and coupled to the upper switch, a capacitor on the power loop substrate and coupled to the upper switch, a first via through the power loop substrate and coupled between the lower switch and the metal layer, and a second via through the power loop substrate and coupled between the capacitor and the metal layer, wherein the power loop substrate has a height and separates the metal layer from the upper switch, lower switch and capacitor by the height.

24 Claims, 14 Drawing Sheets

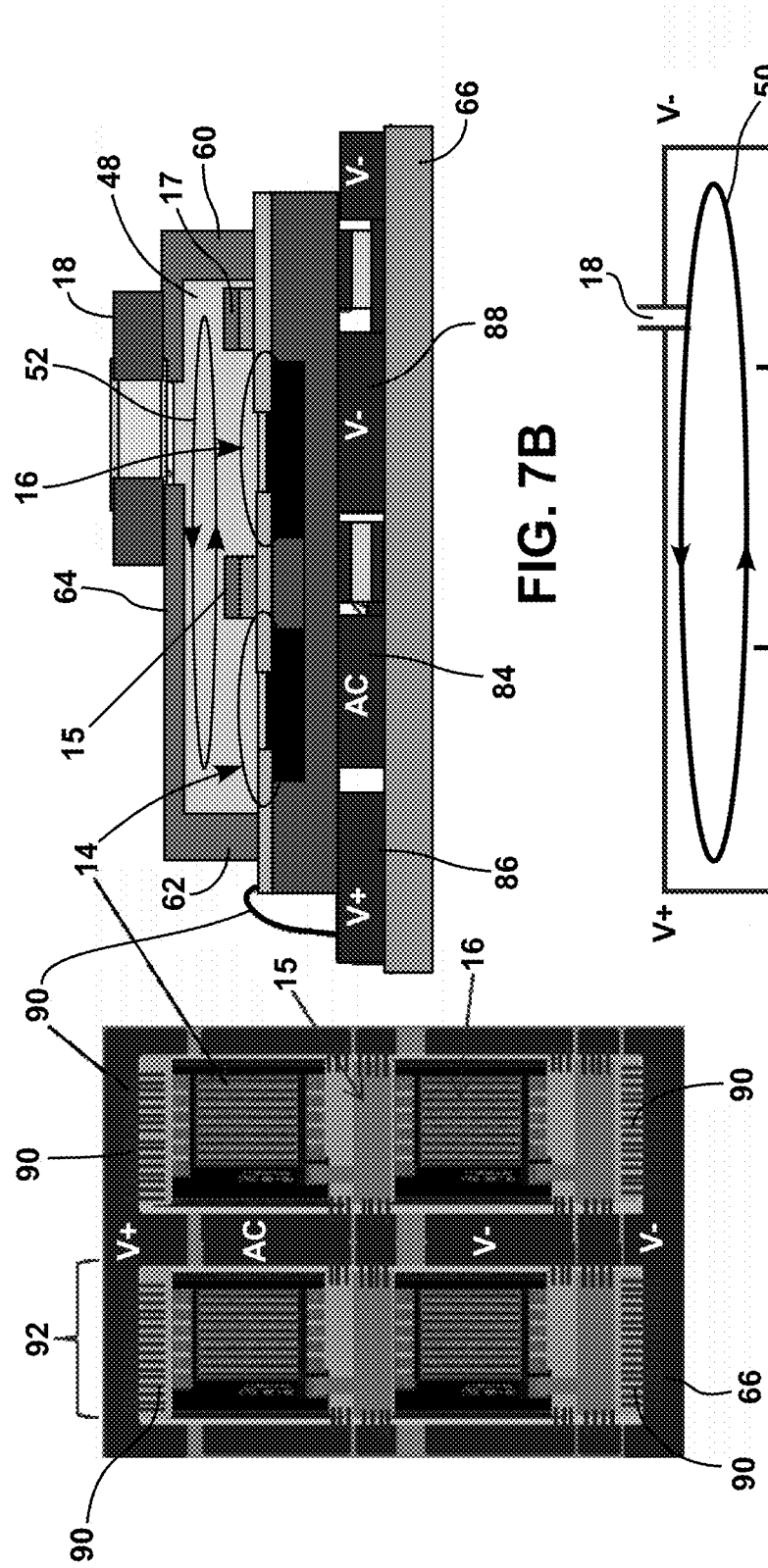
FIG. 7B
FIG. 7C
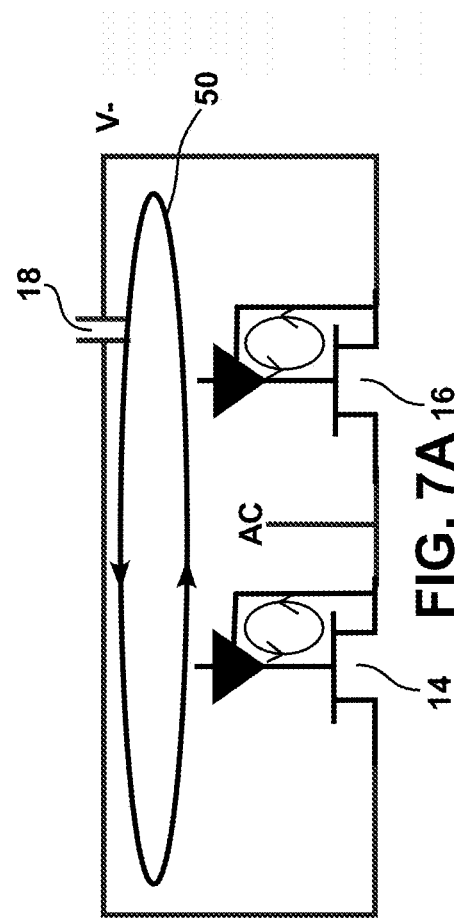
FIG. 7A

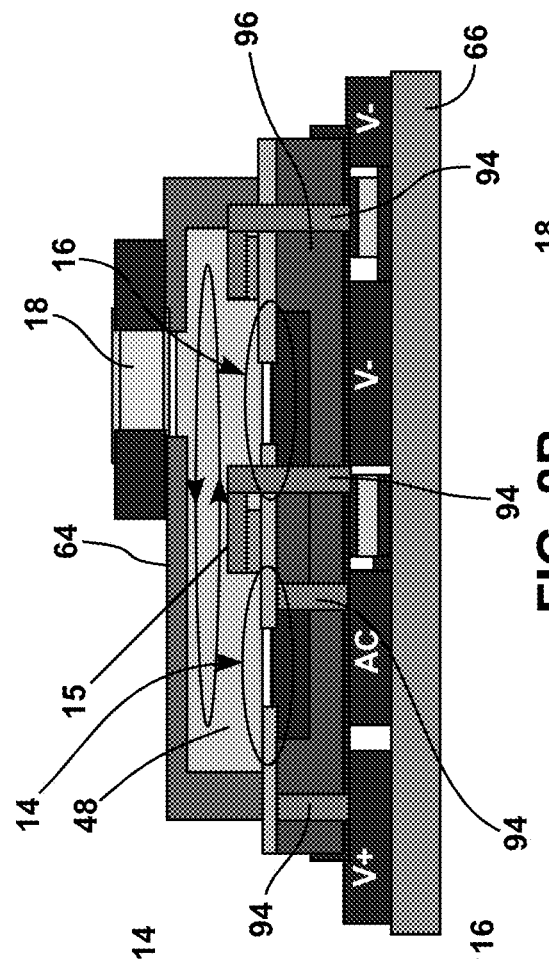

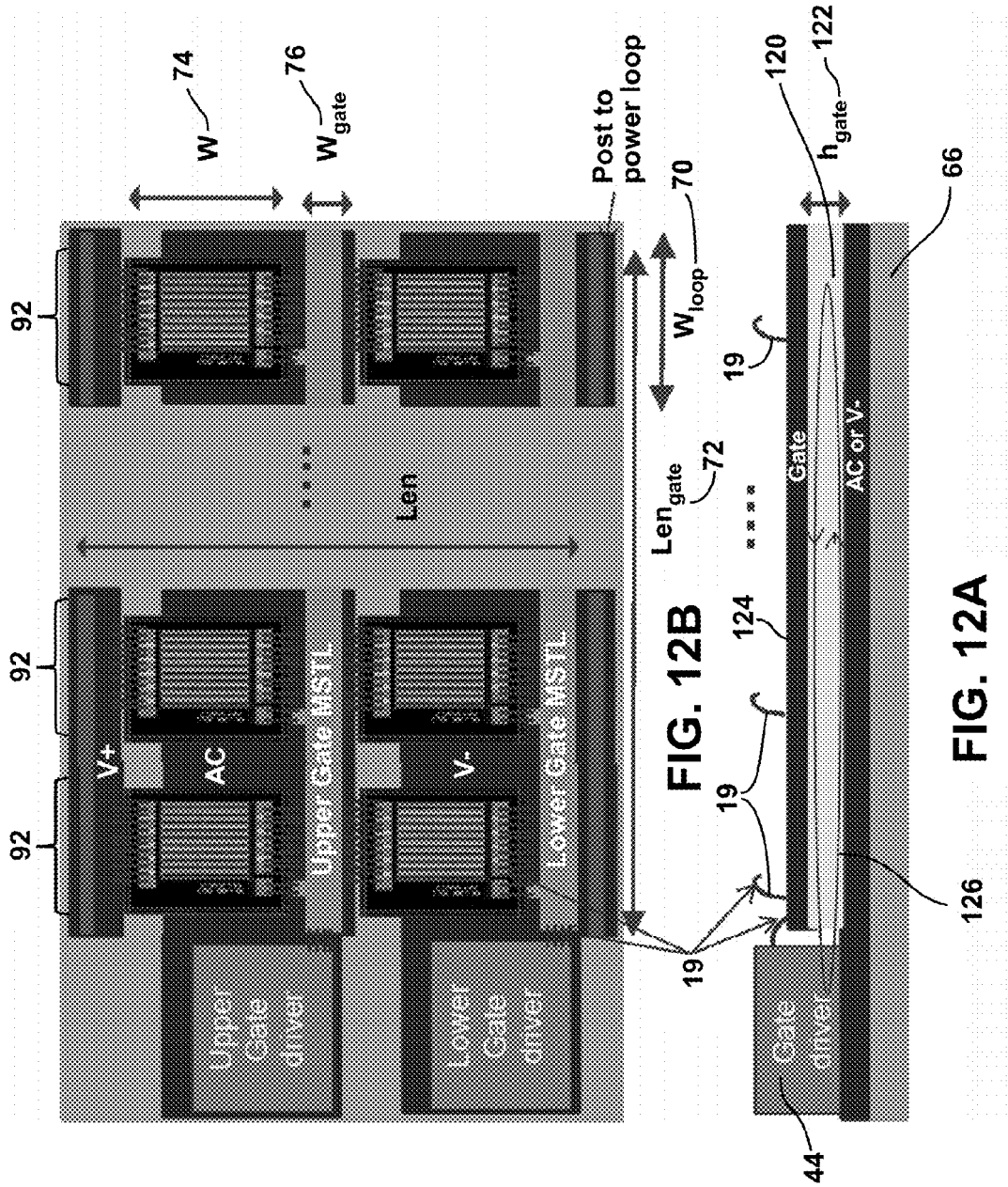

REDUCTION OF THE INDUCTANCE OF POWER LOOP AND GATE LOOP IN A HALF-BRIDGE CONVERTER WITH VERTICAL CURRENT LOOPS

STATEMENT REGARDING FEDERAL FUNDING

This invention was made under U.S. Government contract. The U.S. Government has certain rights in this invention.

CROSS REFERENCE TO RELATED APPLICATIONS

None

TECHNICAL FIELD

This disclosure relates to half bridge circuits and to the reduction of the inductance of power loops and gate loops in a half-bridge converter with vertical current loops.

BACKGROUND

Half-bridges are used to convert direct current (DC) to DC, DC to alternating current (AC), or AC to DC. Switching at higher frequencies enables small, cheaper passive components. For large switches, parasitic inductances and gate resistance slow turn-on time, as illustrated in FIG. 1, which shows a GaN HFET switching on 20 A at 350V.

Inductance in the power loop of a half-bridge slows the current switching time, $\tau_I$, as approximated by Equation 1, below, by reducing the gate voltage by $\Delta V_{gs}$. Gate resistance slows the voltage switching time, $\tau_V$, as approximated by Equation 2, below. $I_d$ and $Q_{gd}$ increase in proportion to switch power, but the parasitic source inductances, $L_s$, and gate resistance, $R_g$, do not reduce in proportion, and consequently large switches have slower turn-on times and are less efficient at high switching frequencies. The positive gate-source voltage, $V_{g+}$, and the plateau voltage, $V_{plat}$, in general do not change with switch size.

$$\tau_I = L_s \cdot \frac{\Delta I_d}{\Delta V_{gs}} \quad (1)$$

$$\tau_V = \frac{Q_{gd} \cdot R_g}{(V_{g+} + V_{plat})} \quad (2)$$

A lateral 20 A GaN HFET switch may have 6 cells in parallel, each with 72 1 mm wide fingers in parallel. In such a design the gate resistance, $R_g$, of the 20 A switch is dominated by the gate feed resistance. Table 1 shows the estimated turn-on times for GaN HFETs of different sizes and types.

| Type | Gate width mm | Rg ohms | Qgd nC | ton ns | Ron ohms | Area mm2 | Rg * Area ohms-mm2 | Ron * Area ohm-mm2 |
|---|---|---|---|---|---|---|---|---|
| 1 cell | 20 | 1.0 | 0.7 | 1.2 | 1.000 | 1.8 | 1.8 | 1.8 |
| 1 cell | 40 | 0.8 | 1.3 | 2.0 | 0.500 | 3.2 | 2.6 | 1.6 |
| 6 cell | 432 | 0.4 | 14.0 | 16.0 | 0.045 | 64.0 | 25.6 | 2.9 |
| 10 parallel | 200 | 0.1 | 7.0 | 2.9 | 0.100 | 17.8 | 1.8 | 1.8 |

In a multi-cell design, the power loop inductance and the switched current increases voltage overshoot. FIG. 2 shows the turn-off of a GaN HFET switching 20 A at 350V resulting in a 150V overshoot from power loop inductance of ~12 nH. Overshoot voltage may damage switches or require switches of a higher voltage rating, which would increase the on resistance ($R_{on}$). High on-resistance results in higher conduction loss and decreased converter efficiency. The on resistance ($R_{on}$) generally increases in proportion to the square of the voltage rating of the switch.

Gate inductance also slows switching and causes ringing. Ringing of the gate voltage can result in high overshoot voltage, which can damage the switches. The intrinsic gate inductance of a lateral switch increases with switch size, along with the gate capacitance. It is challenging to reduce external wire bond gate inductance inversely proportionally to the switch size. The problem of ringing caused by gate inductance and switch capacitance increases with switch size.

As a lateral switch increases in size, the contribution to $R_{on}$ from feed resistance increases rapidly. Device metallization thickness and sheet resistance is usually limited by constraints of the lithographic processes. Wider feed traces, to prevent feed resistance from dominating $R_{on}$, increase switch area, increase $R_{on}$*A, and increase switch cost. Table 1 above shows the increase of $R_{on}$*Area for the 6 cell design with a gate width of 432 mm compared to the single cell or paralleled switches.

Prior art half bridge switches generally used silicon. When higher speed technologies, such as GaN, the switching times are at least 5 times faster, and the above issues are exacerbated.

Finally switch yield of an immature switch technology decreases rapidly with switch size. The yield of small switches can be high, but for large size switches the yield is quite low.

What is needed is a half bridge device that addresses the above problems in the prior art. A half bridge device is desired that reduces source inductance, gate resistance, looping inductance, while increasing switch yield. The embodiments of the present disclosure answer these and other needs.

SUMMARY

In a first embodiment disclosed herein, a half bridge circuit comprises an isolation substrate, a metal layer on one surface of the isolation substrate, a power loop substrate on the metal layer, an upper switch on the power loop substrate, a lower switch on the power loop substrate and coupled to the upper switch, a capacitor on the power loop substrate and coupled to the upper switch, a first via through the power loop substrate and coupled between the lower switch and the metal layer, and a second via through the power loop substrate and coupled between the capacitor and the metal layer, wherein the power loop substrate has a height and separates the metal layer from the upper switch, lower switch and capacitor by the height.

In another embodiment disclosed herein, a half bridge circuit comprises a substrate, an upper switch on the substrate, a lower switch on the substrate and coupled to the upper switch, a second substrate, a metal layer on the second substrate, a first via and a second via coupled to the metal layer, and the first via coupled to the lower switch, a capacitor on the second substrate and coupled to the metal layer and coupled to the upper switch by the second via, and a power loop substrate between the metal layer and the upper and lower switches, wherein the power loop substrate has a height and separates the metal layer from the upper switch and the lower switch by the height.

In yet another embodiment disclosed herein, a half bridge circuit comprises a first substrate, an upper switch on the first substrate, a second substrate, a lower switch on the second substrate, the lower switch facing the upper switch, a first post and second post between the first substrate and the second substrate for supporting the first substrate over the second substrate, the lower switch electrically coupled to the upper switch, a capacitor coupled to the upper switch and coupled to the lower switch, and an power loop substrate between the upper switch and the lower switch, wherein the power loop substrate has a height and separates the metal layer from the upper switch and the lower switch by the height.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 3A shows a diagram of a half-bridge circuit, FIG. 3B shows a cross-section of a half-bridge multi-chip module (MCM) substrate, FIG. 3C shows a planar photo of 10 switches in a parallel half-bridge on a MCM power loop substrate, and FIG. 3D shows a higher magnification photo of the upper and lower switches in accordance with the present disclosure;

FIG. 6A shows a circuit diagram of a half-bridge showing the power loops and key components, and FIG. 6B shows a cross-section of half-bridge MCM substrate showing via connections in accordance with the present disclosure;

FIGS. 7A-7C show an integrated half-bridge with a vertical power loop. FIG. 7A shows a circuit diagram of a half-bridge showing the power loops and key components, FIG. 7B shows a cross-section of a half-bridge integrated circuit (IC) and MCM substrate, and FIG. 7C shows a planar view of two half-bridge ICs on a MCM substrate in accordance with the present disclosure;

FIGS. 8A-8C show an integrated half-bridge with vertical power loop with substrate vias to eliminate bond wires. FIG. 8A shows a circuit diagram of a half-bridge showing the power loops and key components, FIG. 8B shows a cross-section of a half-bridge IC and MCM substrate showing via connections, and FIG. 8C shows a planar view of a two half-bridge IC on a MCM substrate in accordance with the present disclosure;

FIG. 9A shows a circuit diagram of a half-bridge showing the power and gate loops and key components, and FIG. 9B shows a cross-section of half-bridge switches on MCM substrate mounted above each other in accordance with the present disclosure;

FIG. 10A shows a circuit diagram of a half-bridge showing the power loops and key components, and FIG. 10B shows a cross-section of a half-bridge switches with backside vias and MCM substrate in accordance with the present disclosure;

FIGS. 11A and 11B show graphs for an h of 200 μm, and an h of 20 μm in accordance with the present disclosure;

FIGS. 12A and 12B show a vertical gate loop for the embodiment of FIG. 6B. FIG. 12A shows a cross-section of a half-bridge MCM substrate showing a gate loop, and FIG. 12B shows a planar view of half-bridges showing connection and dimensions for the embodiment of FIG. 6B in accordance with the present disclosure;

FIG. 13A shows a cross-section of a half-bridge showing IC and MCM substrate gate loops, and FIG. 13B shows a planar view of half-bridges in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
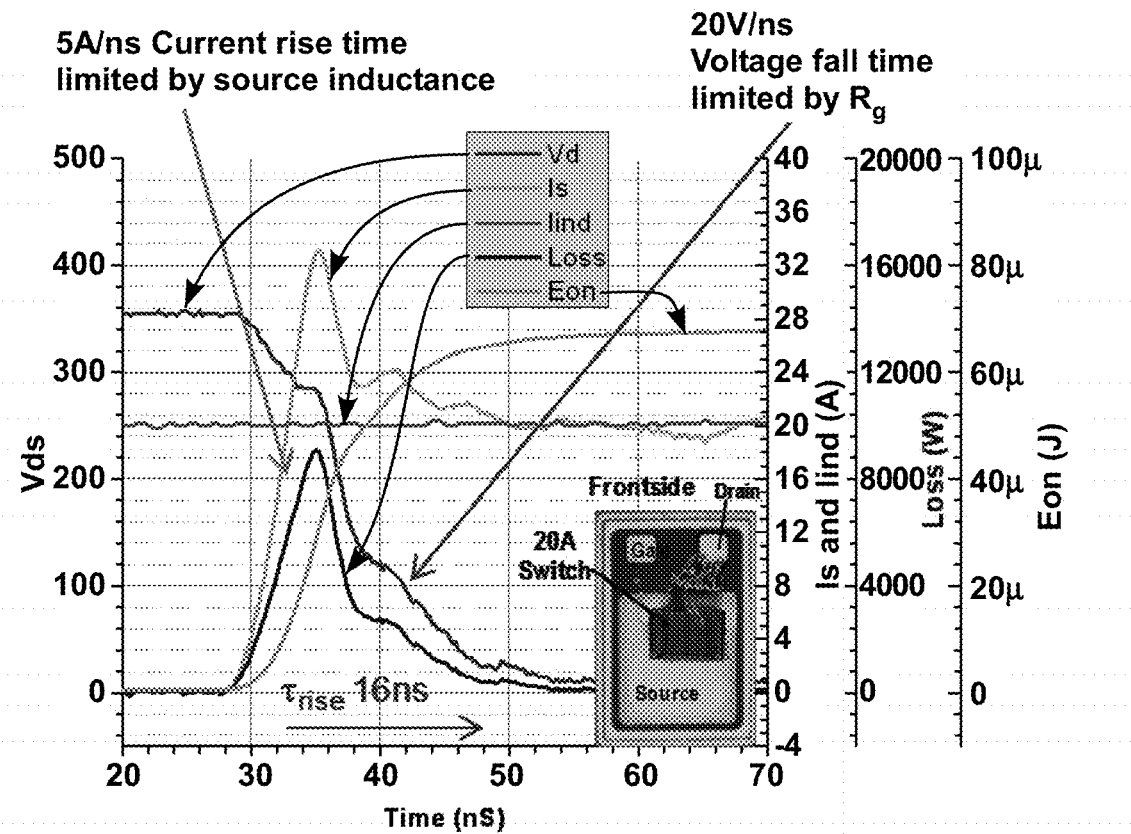
FIG. 1 shows a switching waveform for a GaN HFET switching 20 amps and 350 volts showing a long switching time of 16 ns in accordance with the prior art.
Figure 2:
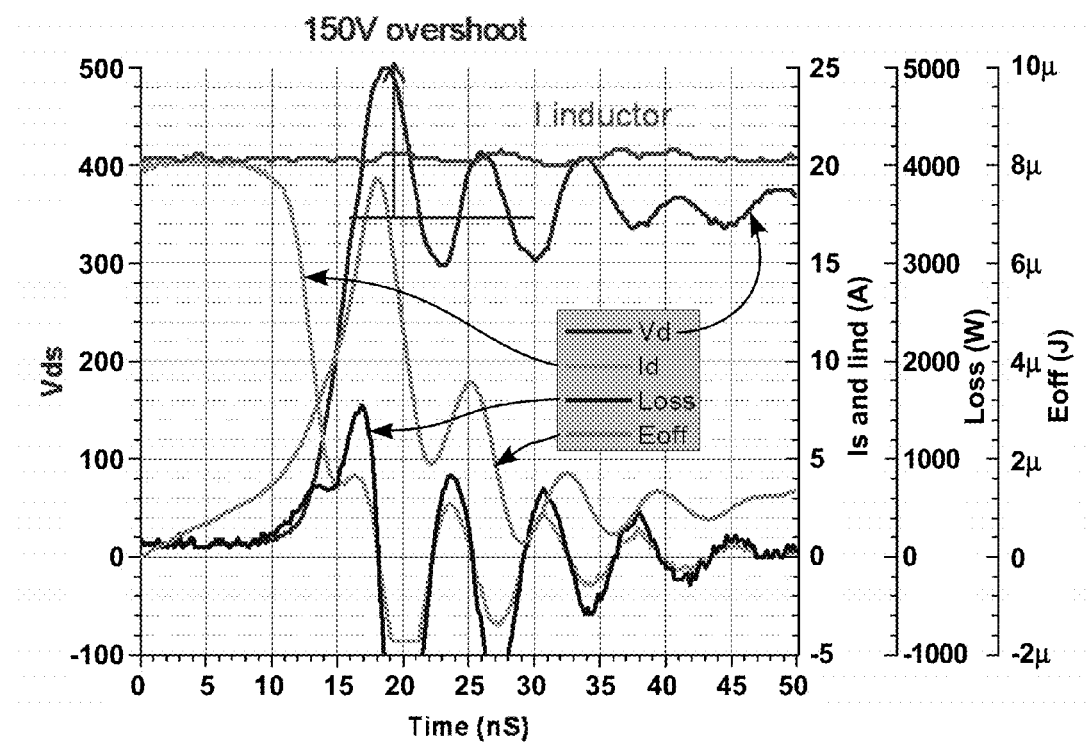
FIG. 2 shows a turn off waveform of a GaN HFET switch showing a 150V overshoot in accordance with the prior art.
Figure 3:
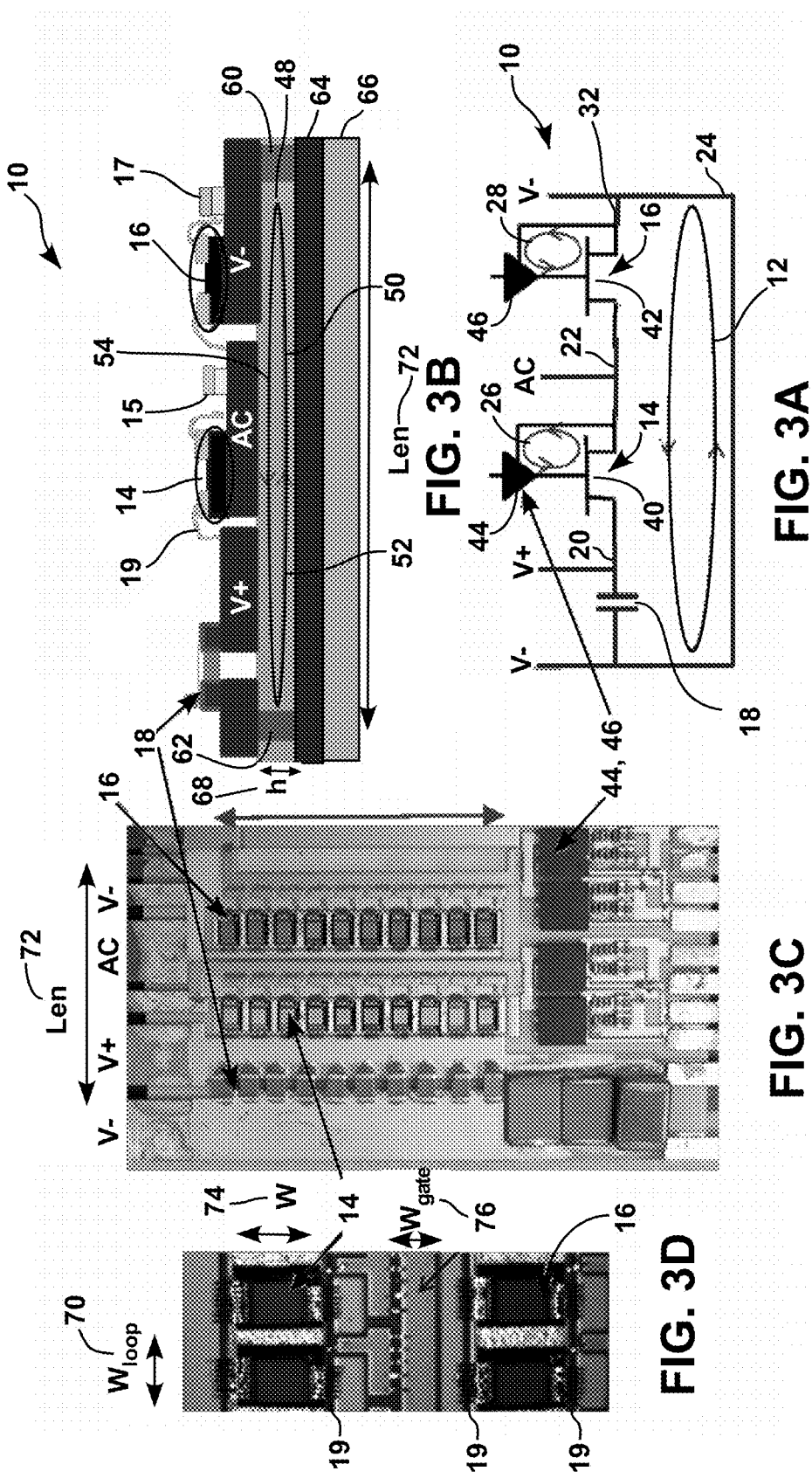
FIGS. 3A-3D show a vertical power loop half-bridge with return current under the switched current and microstrip transmission line (MSTL) gate buses.

FIGS. 3A-3D show a vertical power loop half-bridge 10 with the return current through vias 60 and 62 and metal 64 under the upper and lower switches 14 and 16. In particular, FIG. 3A shows a diagram of half-bridge circuit and shows the vertical power loop 12 passing current through upper switch 14, lower switch 16, capacitor 18 and connections 20, 22, and 24 between them. The connection 24 is the return current connection. In the prior art the connection 24 may be simply a wire between end 32 of the lower switch 16 and the capacitor 18. The upper switch 14 and lower switch 16 may be field effect transistors 40, 42 driven by gate drivers 44 and 46, which may be amplifiers, or a totem pole circuit. Also shown are gate current loops 26 and 28 between the field effect transistors 40, 42 and the gate drivers 44 and 46. A person skilled in the art would understand that the descriptions "upper" and "lower" do not refer to physical arrangement but to the electric potential of the switch with respect to ground.

FIG. 3B shows a cross-section of a half-bridge constructed on a multi-chip module (MCM) in accordance with the present disclosure. FIG. 3C shows a planar photo of ten switches in a parallel half-bridge with a power loop substrate 48 and FIG. 3D shows a higher magnification photo of the upper and lower switches in accordance with the present disclosure.

As shown in FIG. 3B, the vertical power loop 50 has a return current 52, which is near the current 54 through the switches, which may be called the switched current. The vertical power loop 50 oval in FIG. 3B is notional. The switched current 54 actually passes through upper and lower switches 14 and 16 and capacitor 18. The return current 52 is in the opposite direction of the switched current 54 and passes through vias 60 and 62 and metal 64 on the isolation substrate 66. Because the switch current 54 and the return current 52 are close to one another and travel in opposite directions, the magnetic fields from the switched and return currents cancel each other, and effectively reduce the inductance of the vertical power loop 50.

Microstrip transmission lines (MSTLs) 15, 17 may be used for connections to the gate drivers, and reduce the gate inductance as further described below. Bond wires 19 may be used to connect the upper and lower switches 14 and 16.

The amount of cancelling of the magnetic fields from the switched and return currents depends on the ratio of the distance h 68 between the currents, to the path width, $W_{loop}$ 70, which is the width of the metal 64. The power loop inductance, $L_{loop}$, is also proportional to the length of the power loop, Len 72. The loop length Len 72 is preferably at least twice the switch width, W 74, and twice a gate microstrip transmission line (MSTL) width, $W_{gate}$ 76.

The power loop inductance decreases with the ratio of h 68 to $W_{loop}$ 70. The power loop inductance, $L_{loop}$, per length, Len, of power loop may be estimated with a microstrip transmission line (MSTL) model. The power loop inductance of a half bridge with many switches in parallel is more accurately estimated using a 3D electro-magnetic (EM) simulator. The MSTL estimated inductances/length may be derived using Equation 3, below.

Figure 4:
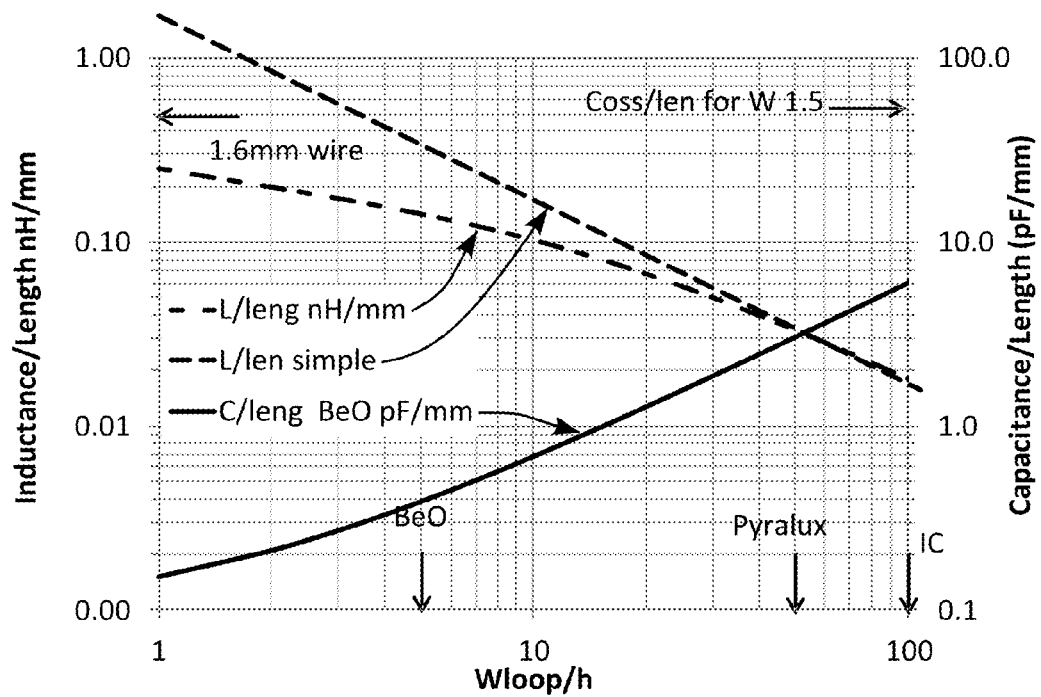
FIG. 4 shows a graph of Inductance and capacitance/length versus W/h of MSTL for dielectric constant of 6.8 and a fringing capacitance of 0.9 pF/mm in accordance with the present disclosure.

FIG. 4 shows the inductance/length and capacitance/length versus W/h for a power loop substrate 48 with a dielectric constant of 6.9, which is the dielectric constant of beryllium oxide (BeO). The dielectric constant only affects the capacitance and has no effect on the inductance. For a $W_{loop}$/h more than 30, the simple expression for inductance/length of $1.7*h/W_{loop}$ is a reasonable estimate. The Equation 3 and plot shows that the inductance of the power loop can be significantly reduced by decreasing the height, h 68, between the switches and return current paths.

$$\frac{L_{loop}}{Len} \approx \frac{W_{loop}}{h}\left(\frac{1}{8}\ln\left[1 + \frac{11.3}{W_{loop}/h}\right]\right)^2 \approx \frac{1.7*h}{W_{loop}} \text{nH/mm} \quad (3)$$

In FIG. 3B, the current in the power loop passes beneath the switches and the bus capacitor 18 is on a top surface. The power loop substrate 48 must be capable of withstanding or supporting the bus voltage or switched voltage, $V_{sw}$, plus overshoot voltage. The switched voltage, $V_{sw}$, is the difference between the DC bus voltage $V_+$ and $V_-$. The power loop substrate 48 for the loop must have a low thermal resistance to conduct away the losses from the switches. Vias 60, 62 in the power loop substrate 48 make the connections from the top circuitry to the metal 64. Other embodiments to connect top and bottom can include wire bonds and wrap around connections; however they would have higher inductance.

Examples of appropriate power loop substrates 48 are BeO and aluminum nitride (AlN), which both have high thermal conductivity and such substrates are available with precise patterned metallization and vias. Alumina ($Al_2O_3$), and direct-bonded-copper are alternative substrates with lower cost, but higher thermal resistance. A printed circuit board (PCB) is much cheaper but has poor thermal conductivity and less precise dimensional control. Thin flexible substrates or flexible printed circuit boards, such as Pyralux, do not have high thermal conductivity, but are thin, and may keep thermal resistance low. The isolation substrate 66 electrically insulates the return current from a heat sink, which may be mounted to isolation substrate 66. The isolation substrate 66 may also have lower thermal resistance to conduct away heat due to switch losses.

The capacitance between the top and the bottom of the vertical power loop 50, $C_{par}$, increases the switch losses by $\frac{1}{2}*f*C_{par}*V_{sw}^2$, where f is the switch frequency. $C_{par}$ preferably is much smaller than $2*C_{oss}$. $C_{par}$/area is estimated using Equation 4 and the results versus $W_{loop}$/h are shown in FIG. 4.

$$\frac{C_{par}}{Len*W_{loop}} \approx \left(\frac{\varepsilon}{h} + C_{finge}\right) \ll \frac{C_{oss}}{W \times W_{loop}} \quad (4)$$

Decreasing the substrate 48 thickness, h 68, to decrease loop inductance, increases $C_{par}$. A lower dielectric constant ∈, reduces $C_{par}$ without changing $L_{loop}$. The estimated loss from $C_{par}$ is small compared to the switch loss for a high dielectric constant substrate, such as BeO, even to high aspect ratios.

Figure 5:
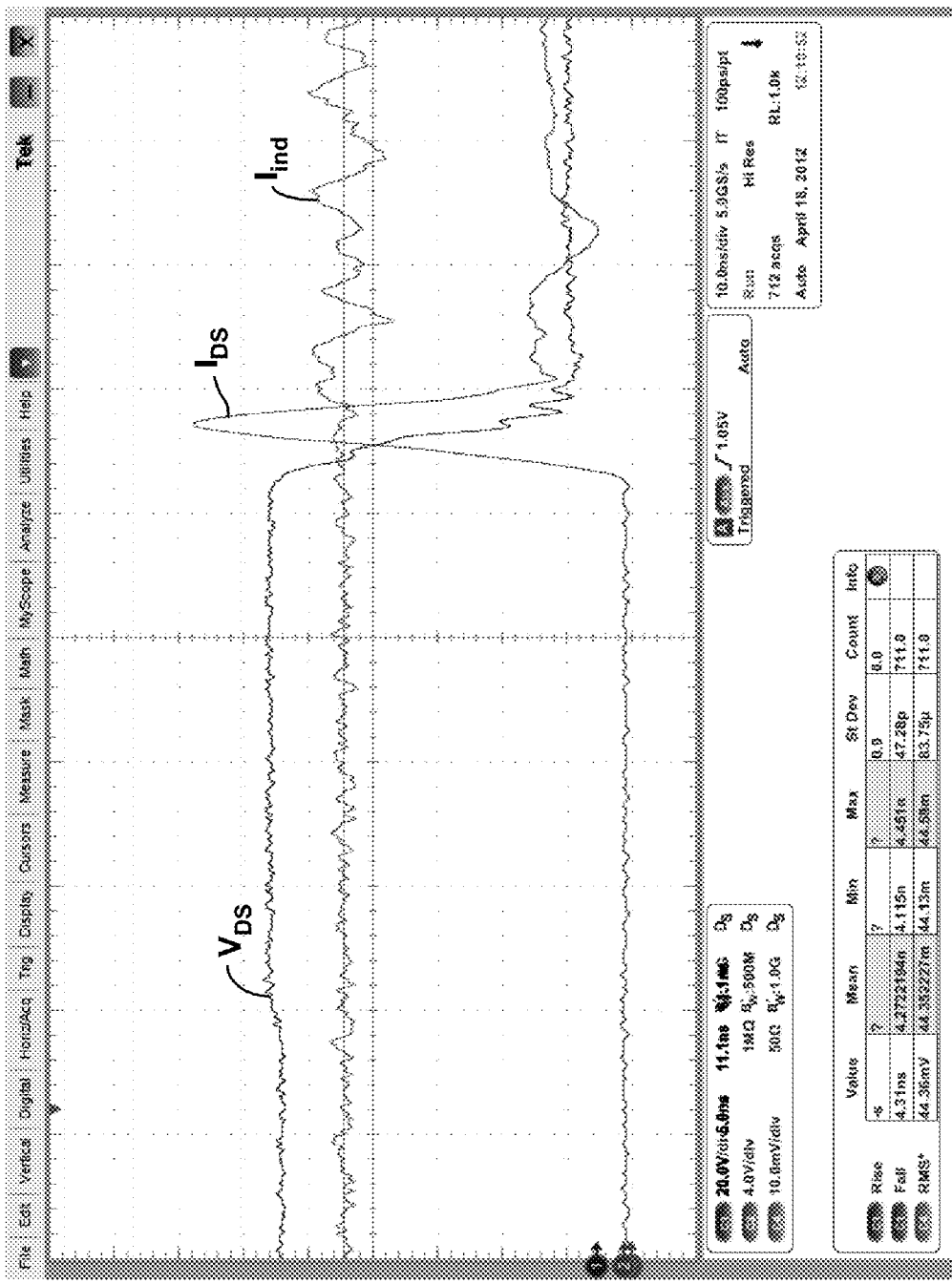
FIG. 5 shows a screen capture of the turn-on of a GaN HFET MCM of ten (10) 20 mm switches, and the MCM switching 8 A and 200V in less than 4 ns, with ringing less than 20V in accordance with the present disclosure.

The device of FIGS. 3B, 3C and 3D has been made and measured using a 0.25 mm BeO MCM substrate. Table 2 summaries the design parameters. Initial performance measurements show fast switching (4 ns) with little ringing (<20V), as shown in FIG. 5. The switching speed may be only limited by the gate driver resistance and the switch maximum gate bias (2.5V). $I_{ind}$ in FIG. 5 refers to the inductor current.

TABLE 2

| Gate (mm) | 20 |
|---|---|
| W (mm) | 1.6 |
| Len (mm) | 13 |
| $W_{loop}$ (mm) | 1.8 |
| E | 3.1 |
| h (mm) | 0.25 |
| $W_{loop}$/h | 7.2 |
| $W_{gate}$ (mm) | 1.6 |
| $h_{gate}$ (mm) | 0.025 |
| $W_{gate}/h_{gate}$ | 64 |
| Switches | 10 |
| Total gate width (mm) | 200 |
| $Len_{gate}$ (mm) | 18 |

Table 3 compares different power loop substrates 48. The minimum substrate thickness or height 68, $h_{min}$, is determined by the mechanical strength for available substrates. Breakdown and $C_{par}$ are not limiting factors. BeO has the best thermal resistance area product.

TABLE 3

| Substate | $E_r$ | Eb (V/um) | h min BV (um) | h min Cpar um | h min available um | h min um | Cpar max (pF/mm2) | Thermal cond W/K-m | Rth * A (K/W * mm2) |
|---|---|---|---|---|---|---|---|---|---|
| GaN Coss/A | | | | | | | 33.3 | | |
| BeO | 6.9 | 10 | 40.0 | 1.82 | 150.0 | 150.00 | 0.40 | 330 | 0.45 |

TABLE 3-continued

| Substate | $E_r$ | Eb (V/um) | h min BV (um) | h min Cpar um | h min available um | h min um | Cpar max (pF/mm2) | Thermal cond W/K-m | Rth * A (K/W * mm2) |
|---|---|---|---|---|---|---|---|---|---|
| AlN | 8.7 | 14.4 | 27.8 | 2.30 | 150.0 | 150.00 | 0.51 | 180 | 0.83 |
| AlO | 9.3 | 9 | 44.4 | 2.46 | 150.0 | 150.00 | 0.55 | 30 | 5.00 |

Figure 6B:
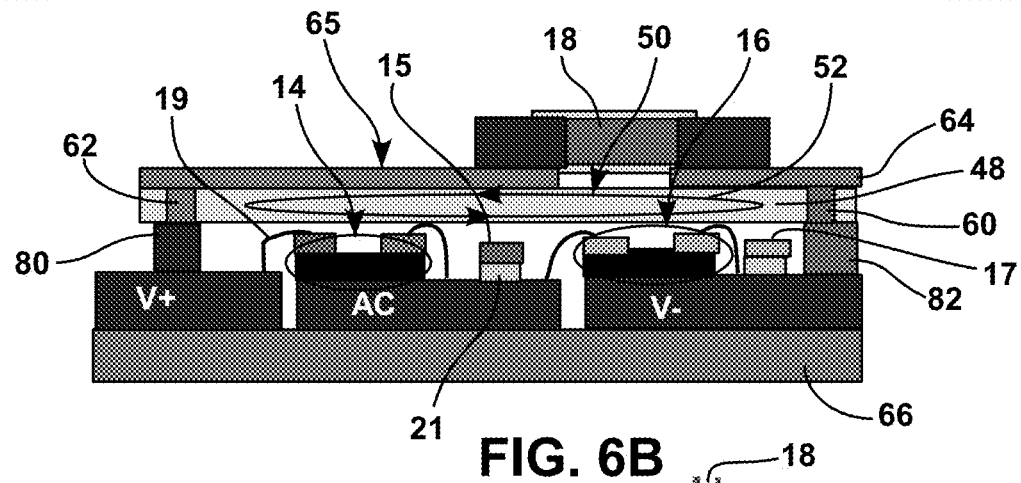
FIGS. 6A and 6B show a vertical power loop half-bridge with return current above the switched current and MSTL gate buses.
Figure 6A:
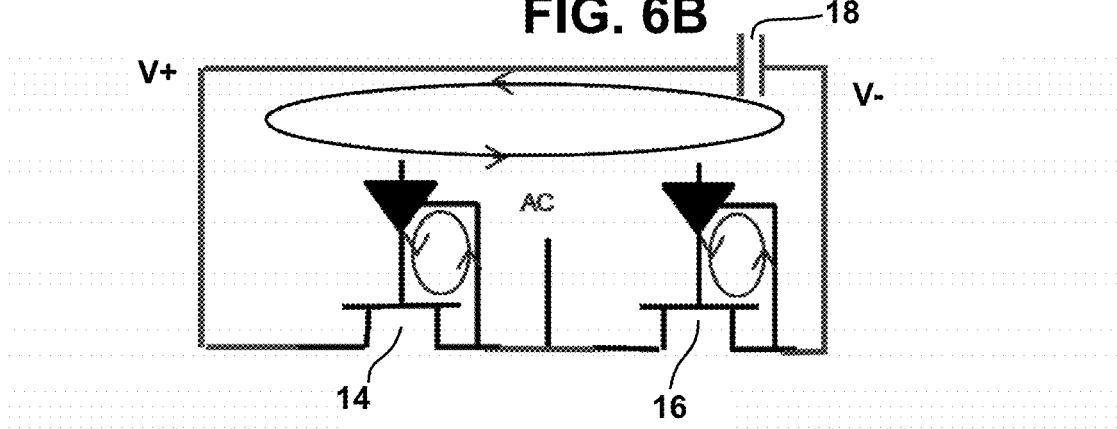

FIGS. 6A and 6B show an embodiment with the return current 52 above the switched current 54 in accordance with the present disclosure. In particular, FIG. 6A shows a circuit diagram of a half-bridge showing the power loops and key components, and FIG. 6B shows a cross-section of half-bridge MCM substrate showing via connections. MSTLs 15 and 17 are used for the gate buses.

The upper switch 14 and the lower switch 16 are on a substrate 66. Conductive posts 80 and 82, which may be metal, support a metalized substrate 65 in FIG. 6B. The posts 80 and 82 need to be taller than the wire bonds 19 to the upper and lower switches 14 and 16, plus a distance to prevent breakdown. The return current passes through the posts 80 and 82 and vias 60 and 62, which are metallized and passes through the metallized substrate 65. The vias 60 and 62 are connected to a metal layer 64 on the metalized substrate 65. The vias 60 and 62 may also be part of the conductive posts 80 and 82. The bus capacitor 18 is mounted above the upper and lower switches 14 and 16 to reduce the length Len of the power loop and to reduce the loop inductance. The power loop dielectric substrate 48 needs to support the switch voltage. A thinner power loop substrate 48, which may be insulating, may be used in the embodiment of FIG. 6 because the substrate 48 is not mechanically supporting the switches like the embodiment of FIG. 3.

Also, for the embodiment of FIG. 6B, the effective height, h, of the loop can be much smaller, e.g., less than 25 μm, and consequently have a much lower inductance. Preferably the power-loop substrate 48 has a high breakdown voltage, such as the breakdown voltage of Pyralux which is 200 V/μm, because the breakdown field of air is low. The heat losses from the upper and lower switches 14 and 16 may be removed from below the switches through substrate 66, which eliminates the need for high thermal conductivity power loop substrate. The substrate 66 preferably is a low thermal resistance MCM substrate for mechanical support and to reduce feed resistance for $R_{on}$. An example of a good power loop substrate 48 is a thin flexible substrate or flexible printed circuit board like Pyralux. Encapsulating the switches or coating the switches and bottom layer of the power loop with Corona Dope insulation is an extra precaution to prevent arcing.

FIGS. 7A-7C show an integrated half-bridge with a vertical power loop in accordance with the present disclosure. In particular, FIG. 7A shows a circuit diagram of a half-bridge showing the power loops and key components, FIG. 7B shows a cross-section of a half-bridge integrated circuit (IC) and MCM substrate, and FIG. 7C shows a planar view of two half-bridge ICs on a MCM.

In this embodiment the half-bridges and vertical loop are integrated using an integrated circuit (IC) process. Lateral switches, which include III-Nitride HFETs, are amenable to integration. The source of the upper switch 14 and the drain of lower switch 16 are connected. The power loop substrate 48 in this embodiment may be made with a low dielectric constant, high breakdown field, IC compatible polymer, which includes, but not limited to, BCB and polyamide. The upper and lower switches 14 and 16 and return current path 52 may be separated by only a few microns and still support the switching voltage because of the high breakdown fields of these polymers. The return current path is through the vias 60, 62, which may be deposited and metal 64, which may also be deposited. The low dielectric constant of polymers, (such as BCB 2.5), do not increase the parasitic capacitance, $C_{par}$, significantly. The bus capacitance can be added as an external high capacitance density chip. The bus capacitance can also be made in the IC process by adding thin dielectric layer with a high dielectric constant, such as $BaTiO_3$.

In the embodiment of FIG. 7B gate transmission lines 15 and 17, which are close to planar with the metallization for the AC 84, V+ 86 and V− 88, enable low thermal resistance attachment of the half bridge IC to the MCM substrate 66. The MCM substrate 66 preferably has a low thermal resistance, $R_{th}$, for transmitting heat losses from the switches to a heat sink.

The embodiment of FIG. 7B still has many bond wires 90 to the low resistance MCM substrate metallization, and needs enough space between half-bridge ICs 92 for bonding to the MCM substrate 66. The space needed for bond wires increases $W_{loop}$ to more than the IC width, and increases the inductance of the gate bus.

FIGS. 8A-8C show an integrated half-bridge with vertical power loop with substrate vias to eliminate bond wires in accordance with the present disclosure. In particular, FIG. 8A shows a circuit diagram of a half-bridge showing the power loops and key components, FIG. 8B shows a cross-section of a half-bridge IC and MCM substrate showing via connections, and FIG. 8C shows a planar view of a two half-bridge ICs 92 on a MCM substrate 66.

The embodiment of FIG. 8B replaces the bond wires 90 in FIG. 7C with IC substrate vias 94, as shown in FIG. 8B. A concern for the bonded wire MCM solution of FIG. 7C is the added cost and reliability of the bond wires. In FIG. 8B the connection to the substrate 66 may be made by placing solder foil between the top of MCM substrate 66 and the bottom of the aligned half bridge IC. At a solder alloy temperature, the solder only wets the metal, resulting in low electrical and thermal resistance contacts where needed and no solder in the gaps. FIG. 8B may have, but is not limited to, III-Nitride switches grown on Si and SiC substrates 96.

There are at least two methods to make the substrate vias 94. First, the substrate vias 94 can be made by etching through the substrate 96 supporting the switches (e.g., 100 μm Si), through the buffer layer (e.g., 3-4 μm GaN), and contacting the correct metal layers near the surface of the half bridge IC. Second, the substrate vias 94 can be made by removing the substrate supporting switches (e.g., Si), and etching through the buffer layer, and contacting the correct metal layers near the surface of the half bridge IC. An insulating layer may be added to the buffer layer after the supporting substrate is removed to reduce substrate leakage current and/or reduce parasitic capacitance to the backside. The half bridge switch IC 92 needs metal patterning on the back of the IC which matches the power loop MCM substrate 48.

Figure 9B:
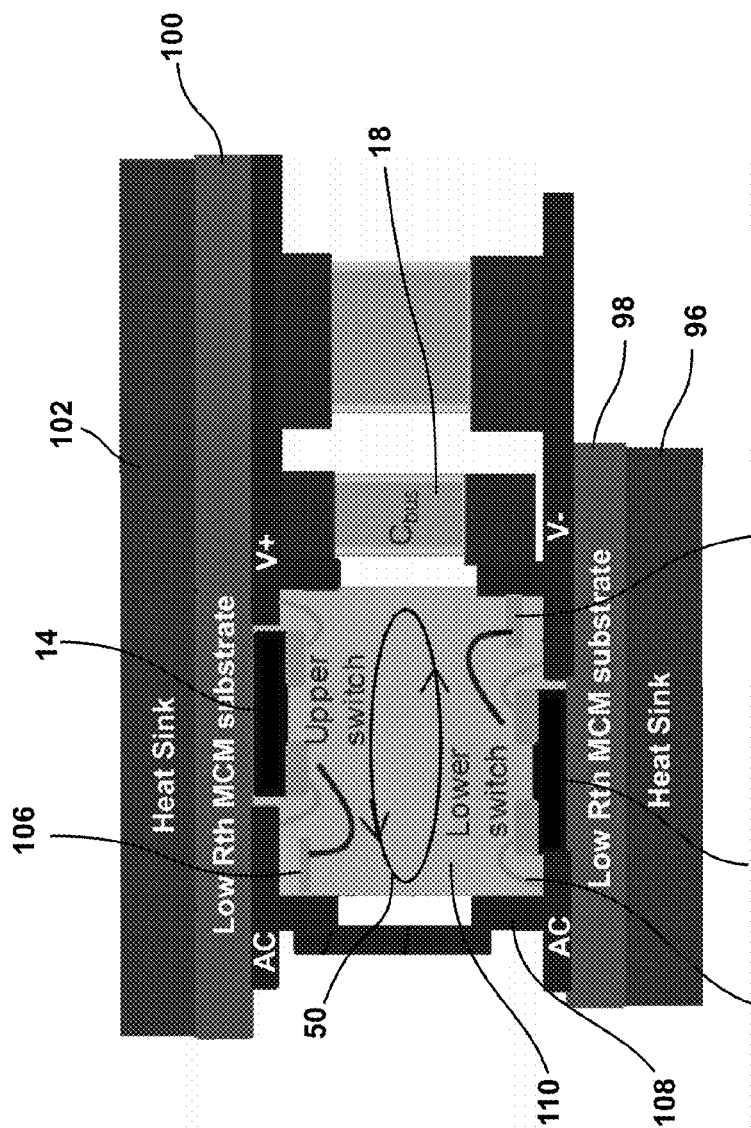
FIGS. 9A and 9B show a vertical power loop with one switch above the other switch.
Figure 9A:
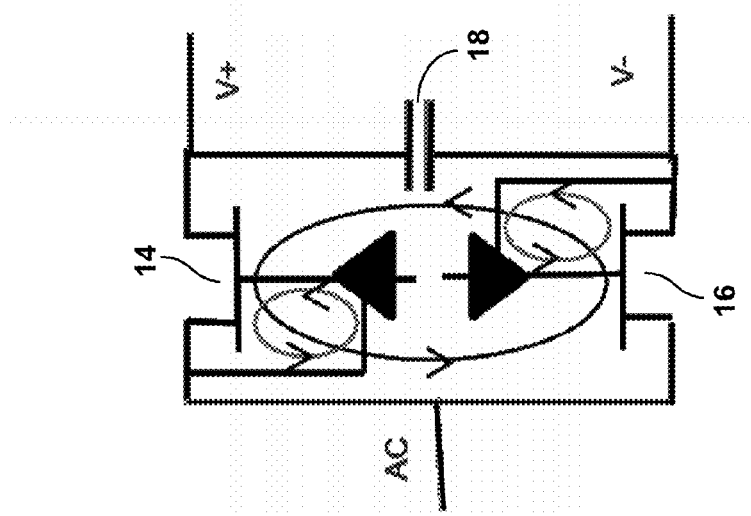

FIGS. 9A and 9B show a vertical power loop with one switch above the other switch. FIG. 9A shows a circuit diagram of a half-bridge showing the power and gate loops and key components, and FIG. 9B shows a cross-section of half-bridge switches on MCM substrate mounted above each other.

The embodiment of FIG. 9B reduces the loop length by placing the upper switch 14 above the lower switch 16, as shown in FIGS. 9A and 9B. Upper switch 14 and lower switch 16 are attached and bonded to low thermal resistance MCM substrates 98 and 100, respectively, which may be attached to heat sinks 96 and 102, respectively. Each substrate 98 and 100 has a gate MSTL 104, 106 for low inductance for the gate drive, similar to the embodiment of FIG. 3. The substrates 98 and 100 have vertical posts 108 to connect to each other directly at the AC connection. The bus capacitor 18 is placed across the V+ and V− posts. Before the bus capacitor 18 is attached to the half bridge, the cavity between the switches is filled with a power-loop dielectric encapsulant 110. The encapsulant 110 must support the switched voltage, to prevent breakdown, and preferably has be low dielectric constant to keep loop parasitic capacitance low. Additional bus capacitance can be added in parallel with the first capacitor, but these capacitors will not have their inductances cancel as much as the first capacitor.

Electro-magnetic (EM) simulation is needed to estimate the power loop inductances and capacitances because the MSTL model is no longer a reasonable approximation. The path length around the power loop 50 is smaller for this embodiment because three sides are the device of the loop. The vertical separation between the upper and lower switches 14 and 16 has to be sufficient to support the switching voltage between the bond wires. This distance can be a few microns. A challenge for this embodiment is fitting the bus capacitance 18 in the gap between the switches.

Another variant of the embodiment of FIG. 9B is not to fill cavity with encapsulant 110, but instead to pass a cooling liquid with a sufficient high dielectric breakdown between the switches. This variant enables double-sided cooling, which allows switch operation at higher loss density for a given maximum junction temperature.

Figures 10A, 10B:
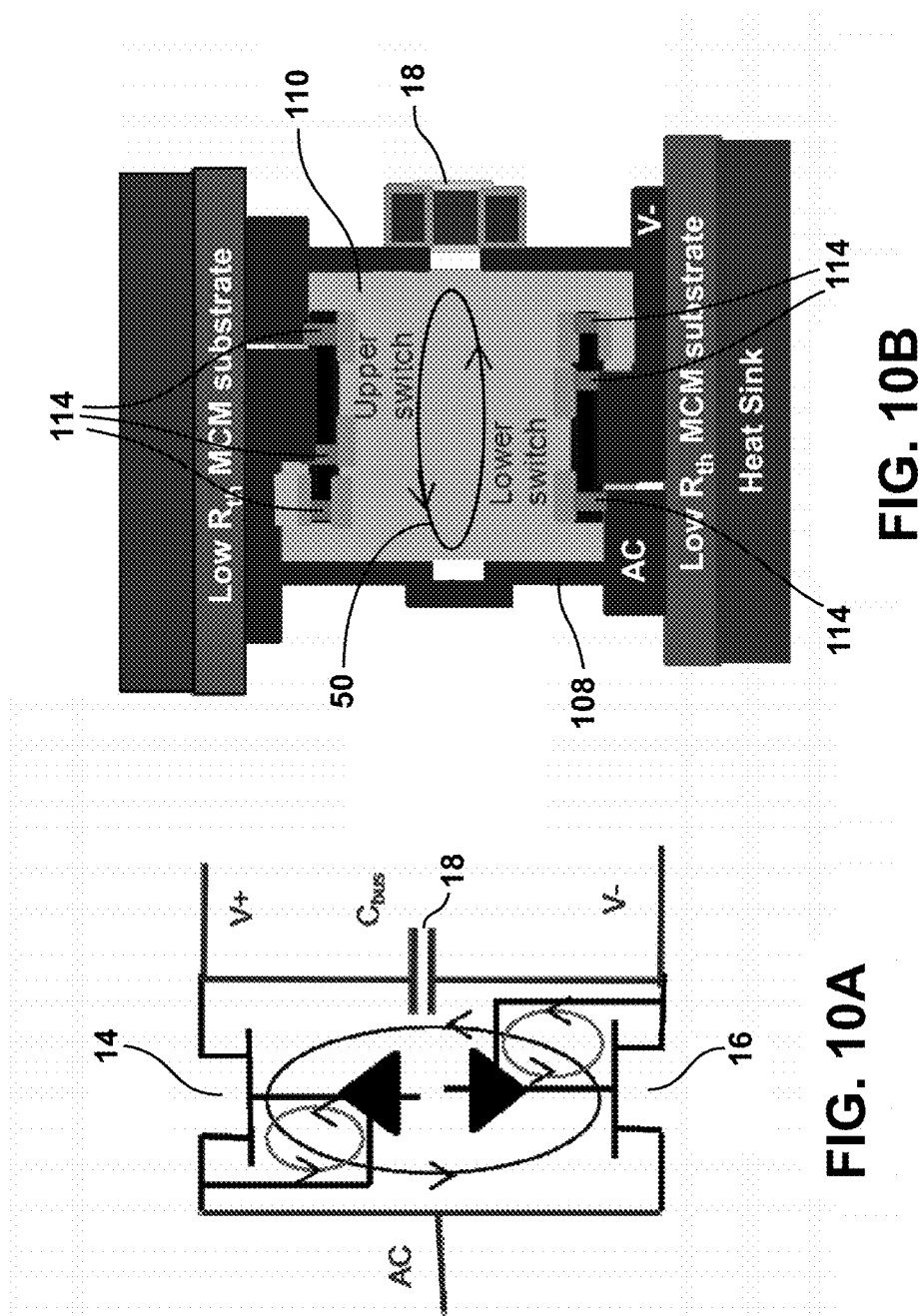
FIGS. 10A and 10B show a vertical power loop with one switch above the other switch, using switches with backside contacts.

FIGS. 10A and 10B show a vertical power loop with one switch above the other switch, using switches with backside contacts in accordance with the present disclosure. In particular, FIG. 10A shows a circuit diagram of a half-bridge showing the power loops and key components, and FIG. 10B shows a cross-section of a half-bridge switches with backside vias and MCM substrate.

The embodiment of FIG. 10B replaces the bond wires 112 for the switches in the embodiment of FIG. 9B with substrate vias 114, as shown in FIG. 10. The advantage of elimination of bond wires is a smaller loop length, and no bond reliability and cost.

The bus capacitance 18 supplies the charge during fast switching. The bus capacitance preferably has a low inductance. The bus capacitance preferably is much larger than $2*C_{oss}$ to prevent local sag in $V_{sw}$. 600V GaN switches have a typical $C_{oss}$ less than 30 pF/mm$^2$. An external bus capacitance can be on top of the substrate in the embodiments of FIGS. 7B and 8B. Including the bus capacitance 18 in the power loop reduces the inductance of the capacitance. The bus capacitance 18 may be made in an integrated circuit (IC) process, but requires a thin high dielectric constant layer capacitor to achieve a capacitance much larger than $2*C_{oss}$.

Voltage overshoot and ringing frequency can limit the size and current of a switch in a power loop. A simplified analysis is given below for estimating the maximum switch size and to give an understanding of the design parameters for increase the maximum switched current. The power and current of the half bridge increase with switch area. The current density, J, is about 100 A/cm$^2$ for a GaN HFET. The inductance of the power loop increases with switch length, Len. The aspect ratio of switches is usually less than 5 for easy handling. For a simplified analysis example, the switch will be assumed to be a square of width W ($W_{loop}$=W). The power loop length, Len, is therefore 2*W plus the length on the V+, V−, and Vac buses.

The ratio of the total length of the buses to 2*W is E, where E is preferably close to 1 to minimize the power loop length. The embodiment of FIG. 3B has an E of 3, as shown in Table 2. The loop inductance is independent of W for a fixed E, because the increase in Len is proportion to W, which is offset but the decrease in inductance/length for the wider trace, $W_{loop}$. The vertical power loop of the embodiments of FIGS. 6B, 7B, 8B and 9B reduces E. The embodiment of FIG. 10B has the lowest E because it eliminates the length for bonding. The loop inductance is set only by the height of the power loop, h, so the embodiment of FIG. 10B has the potential for much lower h.

Figure 11A:
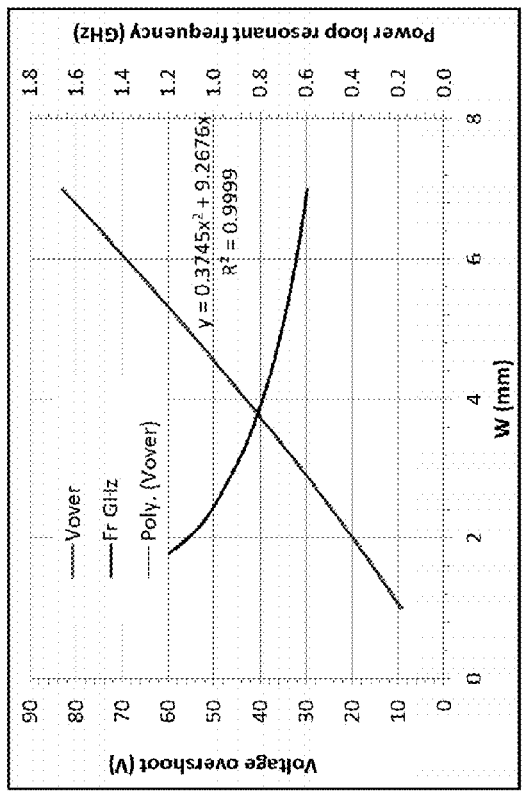
FIGS. 11A and 11B show graphs of voltage overshoot and loop resonant frequency versus switch length, W.
Figure 11B:
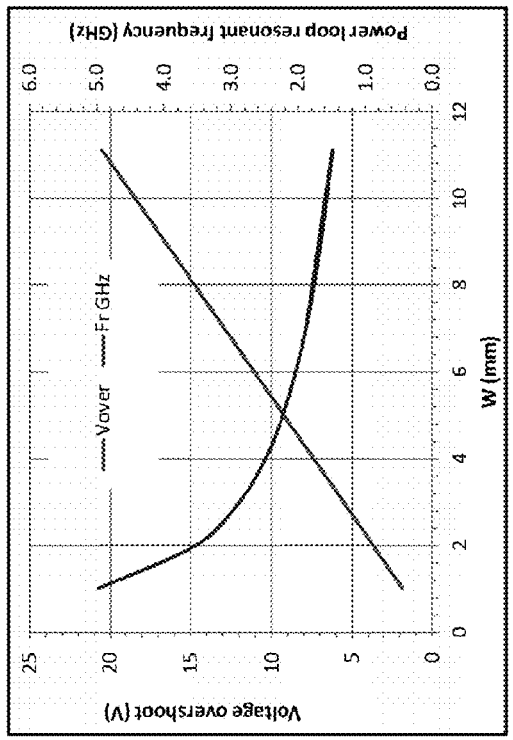

The voltage overshoot is approximated as the product of the switched current and the loop impedance. The loop impedance is the square root of the ratio of loop inductance to $C_{oss}$. The voltage overshoot of a half bridge turning off increases with W, as shown in FIGS. 11A and 11B for a power loop height, h, of 0.2 mm and 0.02 mm. An acceptable voltage overshoot, e.g., 50V, limits the maximum switch width. If the power loop substrate is thinner, then the maximum switch width, set by voltage overshoot, is larger. The resonant frequency of the power loop is calculated from $C_{oss}$ and $L_{loop}$. The loop inductance slows the switching speed. The resonant frequency decreases with switch width, as shown in FIGS. 11A and 11B. The resonant frequency is preferably more than 2× the switching time. For switching in less than 4 ns, the resonant frequency is preferably more than 500 MHz. The reduction of the power loop inductance with the invention of vertical loops enables switching high current switches fast with less voltage overshoot.

The power loop is not naturally damped because $R_{on}$ is much less than the characteristic impedance of the loop, $Z_{loop}$, for a reasonable value of h. To damping the ringing after the voltage overshoot, a resistor larger than $Z_{loop}$ in series with a capacitor (approximately $3*C_{bus}$) is preferably added in parallel with $C_{bus}$. However, the capacitance of the damping capacitor increases the switching loss because the capacitor is charged every cycle. Damping has a significant performance cost for reducing overshoot in the power loop.

Paralleling power loops increases the total current and power of the half bridge. The number of parallel switches, N, can be limited by the gate loop inductance. The last switch input capacitance, $C_{iss}$, can resonate with the whole gate loop inductance, $L_{gN}$. This can result in non-uniform switching currents and in the worst case results in overshoot and damaged switches. The number of switches in parallel is limited by $L_{gN}*C_{iss}$.

In all the embodiments, the gate loop inductance is significantly reduced by using a vertical gate loop, in which the gate return current is close and opposite direction to the gate current. Therefore a large part of the magnetic fields from the currents cancels, and effectively reduces the inductance of the gate loop. The gate loop can have a low inductance because the gate loop substrate can be very thin without degrading performance.

Figure 13A:
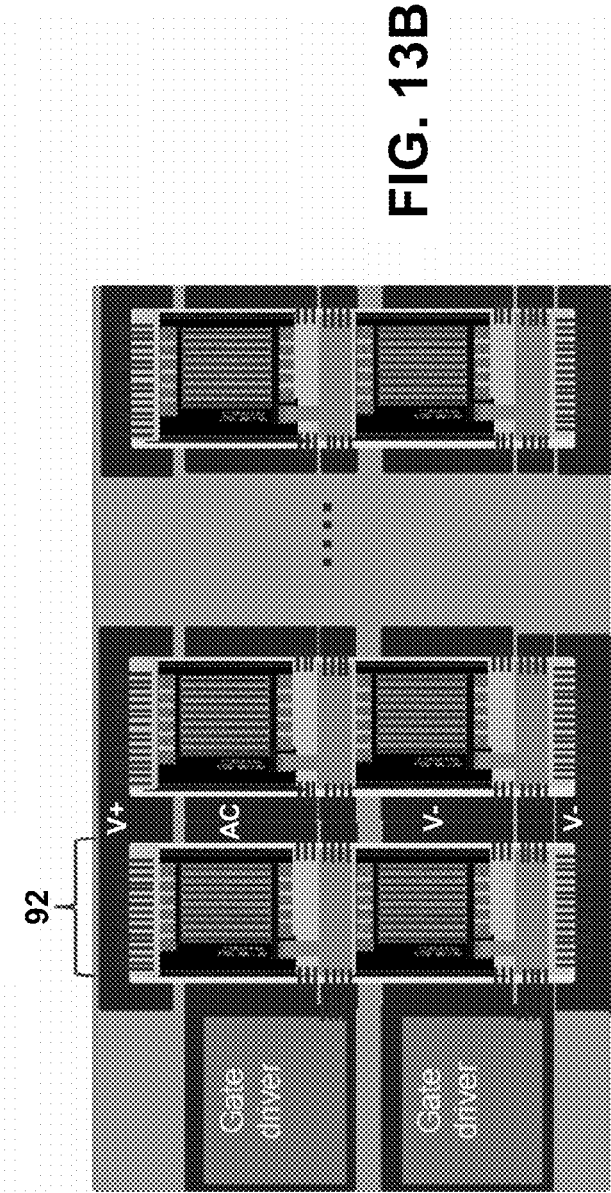
FIGS. 13A and 13B show a vertical gate loop for the embodiment of FIG. 6B using an integrated half-bridge.
Figure 13B:
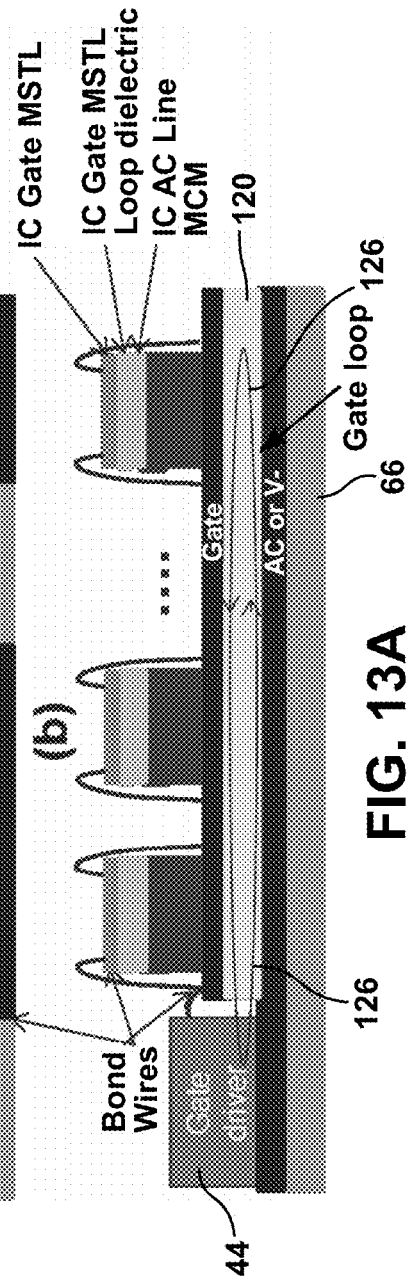

FIGS. 12A and 12B show the gate loop 126 for the embodiment of FIG. 6B and defines the dimensions. The gate loop for the embodiment of FIG. 3B is similar. FIGS. 13A and 13B show the gate loop for the embodiment of FIG. 7B. The gate loop for the embodiment of FIG. 8B is similar to the embodiment of FIG. 7B, but with the IC substrate vias replacing the bond wires to the ICs. The embodiments of FIGS. 7B and 8B are designed for most of the gate current to travel on the MCM gate MSTL to minimize gate resistance.

The gate loop inductance per unit length is approximately proportional to $h_{gate}/W_{gate}$ where $W_{gate}$ is gate bus bar width and $h_{gate}$ is height of the gate loop transmission line. The height 122 of the gate loop 126 from the gate 124 to the substrate 66, which is the thickness of the gate loop dielectric 120, can be very thin. The capacitance of the gate loop does not increase loss significantly because the voltage swing is only the gate voltage (e.g., <+/−20V), which is much smaller than switched voltage $V_{sw}$ (e.g. 300V). The capacitance increases the charge the gate drive 44 must supply and can slow the switching. It is preferred if the gate loop capacitance per switch is small compared to each gate capacitance $C_{iss}$. This criterion is not difficult to meet because GaN HFETs have a high $C_{iss}$/Area (e.g., 100 pF/mm$^2$). The gate capacitance increases in proportion to $W^2$, in the same manner as the switch current.

There are two cases which can limit N, the number of parallel switches. In the first case, for $I_d$ turn-on time to be less than voltage turn-on time, $\tau_{on}$, then resonant frequency, $f_r$, of the last switch is less than $1/(2*\tau_{on})$, as shown below in Equation 5; $L_{gN}$ is $N*L_{gn}$ and $C_{iss}$ increases proportional to $W^2$; and the maximum number of parallel switches, $N_{max}$, is proportional to $1/W^2$. A gate voltage overshoot $V_{go}$ can be limited if it damages the switch. $V_{go}/V_{gp}$ can approach 2 for very high Q. Q increases proportion to N, as shown below in Equation 6. Increasing $R_g$ or W reduces Q, but increases turn-on time, $\tau_{on}$.

A second case is constant turn-on time. Turn-on time increases with increased $Q_{gd}$ for a fixed $R_g$ and $V_{gp}-V_{pl}$, where $V_{pl}$ is the plateau voltage, as shown in Equation 6A. The total $Q_{gd}$ increases with $N*W^2$, therefore $N_{max}$, is proportional to $1/W^2$.

$$f_r=1/(2*\pi*(L_{gN}*C_{iss})^{1/2}=1/(2*\pi*(L_{gn}*[C_{iss}/\text{Area}]*N_{max}*W^2)^{1/2}>1/(2*\tau_{on}) \quad (5)$$

$$Q=Z_{gate}/R_g=(L_{gN}*C_{iss})^{1/2}/R_g=(L_{gn}*N/([C_{iss}/\text{Area}]*W^2))^{1/2}/R_g \quad (6)$$

$$V_{go}/V_{gp}=2-1/Q^{0.77} \quad (6A)$$

A lower gate inductance per switch, $L_{gn}$, allows more parallel switches. $L_{gn}$, increases with $W_{loop}$ 70 which is proportional to switch width W 74, and the simple case is $W_{loop}=W$. Wider gate MSTL, $W_{gate}$ 76, decreases $L_{gn}$, but increases the power loop inductance, so it should be kept small than the switch width, W 74. If the gate MSTL width, $W_{gate}$ 76 increases in proportion to W 74, then the gate inductance per switch, $L_{gn}$, is constant with W 74. The last switch will see and inductance of $L_{gn}$ which $N*L_{gn}$. For $W_{loop}=W$, $C_{iss}$ increase as $W^2$. The $f_r$ or $L_{gN}*C_{iss}$ limit results in the maximum N being proportional to $1/W^2$, or a maximum $N*W^2$, which is called $(NW^2)_{max}$. The second case also has a maximum $N*W^2$.

The total current of the half bridge, $I_{max}$ is proportional to the current density of the switch, J, as shown in Equation 7. The maximum current of the half bridge is independent of W 74 for this model. If the switches have a large W 74, then few can be paralleled. The key to increasing $N*W^2$ and $I_{max}$ is decreasing $L_{gn}$, which requires decreasing $h_{gate}$.

$$I_{max}=J*(W^2*N)_{max} \quad (7)$$

The gate dielectric 120 of the gate transmission lines only needs to support the gate voltage, which is less than +/−20V. The gate transmission lines do not have to provide any mechanical support. The gate dielectric 120 can be very thin for low inductance. A low dielectric constant is preferred for the gate transmission line because it increases the capacitance drive by the gate driver. The gate transmission line capacitance should be less than $C_{iss}$. The transmission line capacitance does not significantly increase the switching loss for high-voltage (>100V) switches.

The embodiment of FIG. 3B may be realized using 250 μm BeO as the gate transmission line and 25 μm Pyralux for the gate dielectric 120. Ten switches have been successfully paralleled with these gate transmission lines. The estimated gate inductances for BeO and Pyralux are 300 pH/switch and 30 pH/switch respectively. For the integrated circuit (IC) embodiments of FIGS. 7B and 8B, the gate transmission line on the MCM substrate may be needed for low gate feed resistance. The MCM gate transmission line needs to be planar with the other metallization to allow good thermal and electrical attachment to the MCM substrate.

Figure 14:
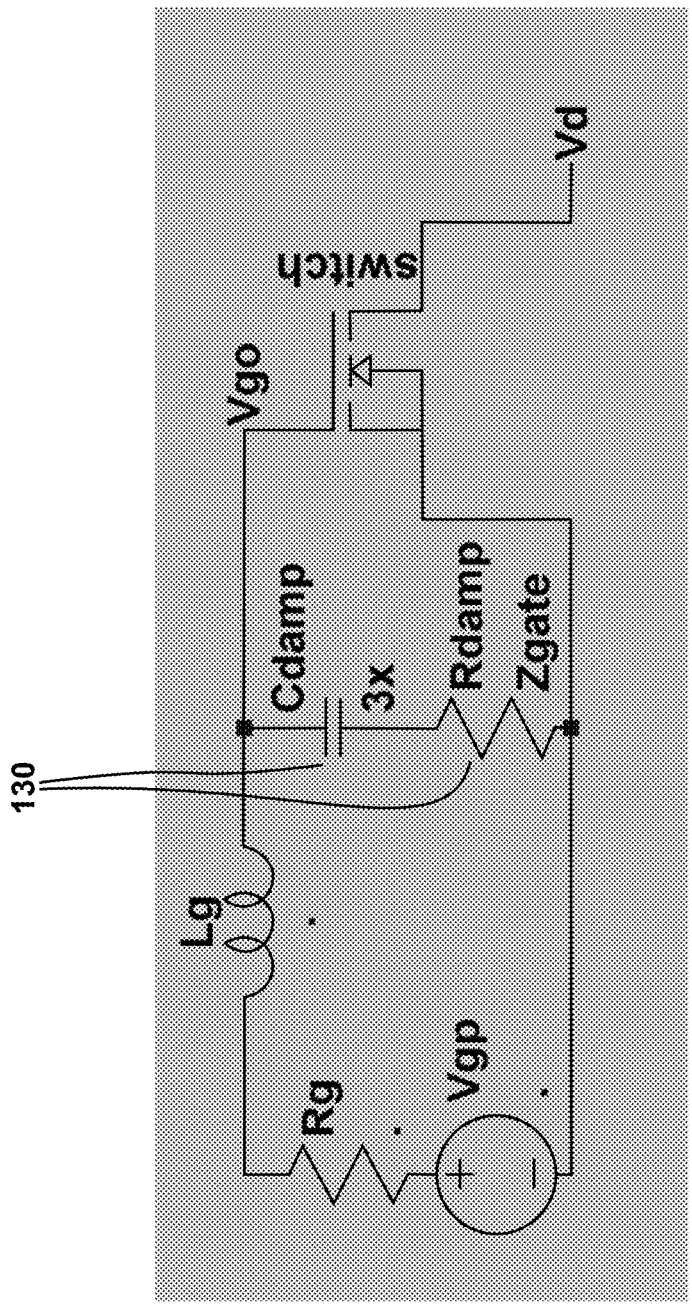
FIG. 14 shows a damping network for one segment of a gate MSTL in accordance with the present disclosure.

For a Q greater than 3, which is a normal case, the gate resonance can be damped by adding a series resistor capacitor (RC) 130 in parallel with $C_{gs}$, as shown in FIG. 14. The $C_{damp}$ is preferably about $3\times C_{gs}$. The $R_{damp}$ is preferably $Z_{gate}$, which increases along the gate MSTL because $L_{gate}$ increases with N. The damping can reduce $V_{go}/V_{gp}$ to about 3 without increases current switching time by more than 20%.

High current switches for greater than 50 amps of switching require very large gate width for the switch, for example 1000 mm wide with no defects. Defect density usually decreases with high volume manufacturing experience. However, for relatively immature device technologies, yield may be low for large gate width switches with no defects. The yield for lower current switches (e.g., <8A) is acceptable.

In this disclosure multi-chip-modules (MCMs) are used to parallel new device technology switches. Known-good-die can be automatically placed on the MCM with high precision. Automatic bonders can quickly and precisely connect the devices. The small increase in cost for assembling more die is easily off set by the increase in yield, and using less area on the die for low resistance interconnects. The use of MCMs to package half-bridges enables affordable high-current half-bridges years before the device technology matures to yield high current switches.

It is challenging to attach current switches to a substrate with low thermal resistance and reliable operation over thermal cycling because the switch die are large (e.g., 10×10 mm for a 200 A Si IGBT). All voids must be eliminated over the entire large area of the die, and no voids must form during the mechanical stress of thermal cycling. For the MCM approach, the die are much smaller, (e.g., 2×2 mm) which alleviates many of the attachment problems. Removing heat from large die is also challenging because it is difficult to spread the heat. Loss is often limited to about 200 W/cm$^2$ with a heat sink directly under the large switch. The loss density limits the maximum switching power density. Using MCMs according to this disclosure can enable a higher loss density and thus a higher switched power density, because there is a higher periphery to area ratio to spread the heat.

The feed resistances for $R_{on}$ and $R_g$ for a lateral switch can increase rapidly with switch size, W 74, until the feed resistances dominate $R_{on}$ and $R_g$. For a 50 A switches GaN switch, the feed traces use up 50% of area to keep feed resistance less than 20% of the total on-resistance. The gate feed resistance can completely dominate multi-cell switches. The switching speed of 20 A GaN switches is limited by the gate feed resistance.

Table 1 shows the increase in $R_{on}$*Area and $R_g$*Area for a 432 mm switch versus a 40 mm switch. The metallization thickness on semiconductor wafers is usually limited to 1 to 10 μm, while MCM substrates may have metal thicknesses of more than 2000 μm. Wider feed traces on switches use up valuable chip area. The cost/area for metalized insulating MCM substrates is much lower than semiconductor switch substrates. Wide traces are also much more affordable for MCM substrates. Feed resistance is negligible when using metalized MCM substrates. The many bond wires or ribbons for attaching to the MCM with low inductance also have low resistance. Further, the substrate vias for the embodiment of FIG. 10 have low resistance as the vias are filled with metal.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

CONCEPTS

This disclosure includes at least the following concepts.
Concept 1. A half bridge circuit comprising:
an isolation substrate;
a metal layer on one surface of the isolation substrate;
a power loop substrate on the metal layer;
an upper switch on the power loop substrate;
a lower switch on the power loop substrate and coupled to the upper switch;
a capacitor on the power loop substrate and coupled to the upper switch;
a first via through the power loop substrate and coupled between the lower switch and the metal layer; and
a second via through the power loop substrate and coupled between the capacitor and the metal layer;
wherein the power loop substrate has a height and separates the metal layer from the upper switch, lower switch and capacitor by the height.

Concept 2. The half bridge circuit of concept 1 wherein:
switched current passes through the upper switch, the lower switch, and the capacitor; and
return current passes through the first via, the second via, and the metal layer;
wherein a power loop inductance in a path for the switched current and the return current depends on a ratio of the height to a width of the metal layer.

Concept 3. The half bridge circuit of concept 1:
switched current passes through the upper switch, the lower switch, and the capacitor; and
return current passes through the first via, the second via, and the metal layer;
wherein a power loop inductance in a path for the switched current and the return current is proportional to a length between the first via and the second via; and
wherein the length between the first via and the second via is at least twice a width of the upper switch or the lower switch.

Concept 4. The half bridge circuit of concept 1 wherein:
the power loop substrate comprises BeO, AlN, $Al_2O_3$, direct-bonded cooper, or a flexible printed circuit board.

Concept 5. The half bridge circuit of concept 1 wherein:
the upper switch comprises a field effect transistor, having a gate coupled to a gate driver, a source, and a drain;
the lower switch comprises a field effect transistor, having a gate coupled to a gate driver, a source, and a drain;
wherein the source of the upper switch is connected to the drain of the lower switch;
wherein the source of the upper switch is coupled to the gate driver coupled to the upper switch; and
wherein the source of the lower switch is coupled to the gate driver coupled to the lower switch.

Concept 6. The half bridge circuit of concept 5:
wherein a connection between the source of the upper switch and the gate driver coupled to the upper switch and a connection between the gate driver coupled to the upper switch and the gate of the field effect transistor of the upper switch are microstrip transmission lines; and
wherein a connection between the source of the lower switch and the gate driver coupled to the lower switch and a connection between the gate driver coupled to the lower switch and the gate of the field effect transistor of the lower switch are microstrip transmission lines.

Concept 7. The half bridge circuit of concept 1 wherein:
an alternating circuit source is connected to the upper switch and the lower switch;
a positive voltage source is connected to the capacitor and the upper switch; and
a negative voltage source is connected to the capacitor, the lower switch and the metal layer.

Concept 8. The half bridge circuit of concept 1 further comprising
a multi-chip module for packaging the upper switch, the lower switch, and the power loop substrate.

Concept 9. A half bridge circuit comprising:
a substrate;
an upper switch on the substrate;
a lower switch on the substrate and coupled to the upper switch;
a second substrate;
a metal layer on the second substrate;
a first via and a second via coupled to the metal layer, and the first via coupled to the lower switch;

a capacitor on the second substrate and coupled to the metal layer and coupled to the upper switch by the second via; and a power loop substrate between the metal layer and the upper and lower switches;

wherein the power loop substrate has a height and separates the metal layer from the upper switch and the lower switch by the height.

Concept 10. The half bridge circuit of concept 9 wherein:

switched current passes through the upper switch and the lower switch; and return current passes through the first metal post, the second metal post, the capacitor and the metal layer;

wherein a power loop inductance in a path for the switched current and the return current depends on a ratio of the height to a width of the metal layer.

Concept 11. The half bridge circuit of concept 9:

switched current passes through the upper switch and the lower switch; and return current passes through the first metal post, the second metal post, the capacitor and the metal layer;

wherein a power loop inductance in a path for the switched current and the return current is proportional to a length between the first via and the second via; and wherein the length between the first via and the second via is at least twice a width of the upper switch or the lower switch.

Concept 12. The half bridge circuit of concept 9 wherein:

the power loop substrate comprises BeO, AlN, $Al_2O_3$, direct-bonded cooper, or a flexible printed circuit board.

Concept 13. The half bridge circuit of concept 9 wherein:

the upper switch comprises a field effect transistor, having a gate coupled to a gate driver, a source, and a drain;

the lower switch comprises a field effect transistor, having a gate coupled to a gate driver, a source, and a drain;

wherein the source of the upper switch is connected to the drain of the lower switch;

wherein the source of the upper switch is coupled to the gate driver coupled to the upper switch; and wherein the source of the lower switch is coupled to the gate driver coupled to the lower switch.

Concept 14. The half bridge circuit of concept 13:

wherein a connection between the source of the upper switch and the gate driver coupled to the upper switch and a connection between the gate driver coupled to the upper switch and the gate of the field effect transistor of the upper switch are microstrip transmission lines; and wherein a connection between the source of the lower switch and the gate driver coupled to the lower switch and a connection between the gate driver coupled to the lower switch and the gate of the field effect transistor of the lower switch are microstrip transmission lines.

Concept 15. The half bridge circuit of concept 9 wherein:

an alternating circuit source is connected to the upper switch and the lower switch;

a positive voltage source is connected to the capacitor and the upper switch; and a negative voltage source is connected to the capacitor, the lower switch and the metal layer.

Concept 16. The half bridge circuit of concept 9 further comprising:

first and second metal posts coupled to the first and second vias for supporting the second substrate; and a multi-chip module for packaging the upper switch, the lower switch, and the power loop substrate.

Concept 17. The half bridge circuit of concept 9 wherein the upper switch and the lower switch are integrated on an integrated circuit.

Concept 18. A half bridge circuit comprising:

a first substrate;

an upper switch on the first substrate;

a second substrate;

a lower switch on the second substrate, the lower switch facing the upper switch;

a first post and second post between the first substrate and the second substrate for supporting the first substrate over the second substrate;

the lower switch electrically coupled to the upper switch;

a capacitor coupled to the upper switch and coupled to the lower switch; and an power loop substrate between the upper switch and the lower switch;

wherein the power loop substrate has a height and separates the metal layer from the upper switch and the lower switch by the height.

Concept 19. The half bridge circuit of concept 18 wherein:

switched current passes through the upper switch and the lower switch; and return current passes through the capacitor and the first post;

wherein a power loop inductance in a path for the switched current and the return current depends the height.

Concept 20. The half bridge circuit of concept 18 wherein:

the power loop substrate comprises BeO, AlN, $Al_2O_3$, direct-bonded cooper, or a flexible printed circuit board.

Concept 21. The half bridge circuit of concept 18 wherein:

the upper switch comprises a field effect transistor, having a gate coupled to a gate driver, a source, and a drain;

the lower switch comprises a field effect transistor, having a gate coupled to a gate driver, a source, and a drain;

wherein the source of the upper switch is connected to the drain of the lower switch;

wherein the source of the upper switch is coupled to the gate driver coupled to the upper switch; and wherein the source of the lower switch is coupled to the gate driver coupled to the lower switch.

Concept 22. The half bridge circuit of concept 21:

wherein a connection between the source of the upper switch and the gate driver coupled to the upper switch and a connection between the gate driver coupled to the upper switch and the gate of the field effect transistor of the upper switch are microstrip transmission lines; and wherein a connection between the source of the lower switch and the gate driver coupled to the lower switch and a connection between the gate driver coupled to the lower switch and the gate of the field effect transistor of the lower switch are microstrip transmission lines.

Concept 23. The half bridge circuit of concept 18 wherein:

an alternating circuit source is connected to the upper switch and the lower switch;

a positive voltage source is connected to the capacitor and the upper switch; and a negative voltage source is connected to the capacitor, the lower switch and the metal layer.

Concept 24. The half bridge circuit of concept 18 further comprising:

a first heat sink connected to the first substrate; and a second heat sink connected to the second substrate.

What is claimed is:

1. A half bridge circuit comprising:

an isolation substrate;

a metal layer on one surface of the isolation substrate;

a power loop substrate on the metal layer;

an upper switch on the power loop substrate;

a lower switch on the power loop substrate and coupled to the upper switch;
a capacitor on the power loop substrate and coupled to the upper switch;
a first via coupled between the lower switch and the metal layer, the first via extending through the power loop substrate; and
a second via coupled between the capacitor and the metal layer, the second via extending through the power loop substrate;
wherein the power loop substrate has a height and separates the metal layer from the upper switch, lower switch and capacitor by the height.

2. The half bridge circuit of claim 1 wherein:
switched current passes through the upper switch, the lower switch, and the capacitor; and
return current passes through the first via, the second via, and the metal layer;
wherein a power loop inductance in a path for the switched current and the return current depends on a ratio of the height to a width of the metal layer.

3. The half bridge circuit of claim 1:
switched current passes through the upper switch, the lower switch, and the capacitor; and
return current passes through the first via, the second via, and the metal layer;
wherein a power loop inductance in a path for the switched current and the return current is proportional to a length between the first via and the second via; and
wherein the length between the first via and the second via is at least twice a width of the upper switch or the lower switch.

4. The half bridge circuit of claim 1 wherein:
the power loop substrate comprises BeO, AlN, $Al_2O_3$, direct-bonded cooper, or a flexible printed circuit board.

5. The half bridge circuit of claim 1 wherein:
the upper switch comprises a field effect transistor, having a gate coupled to a gate driver, a source, and a drain;
the lower switch comprises a field effect transistor, having a gate coupled to a gate driver, a source, and a drain;
wherein the source of the upper switch is connected to the drain of the lower switch;
wherein the source of the upper switch is coupled to the gate driver coupled to the upper switch; and
wherein the source of the lower switch is coupled to the gate driver coupled to the lower switch.

6. The half bridge circuit of claim 5:
wherein a connection between the source of the upper switch and the gate driver coupled to the upper switch and a connection between the gate driver coupled to the upper switch and the gate of the field effect transistor of the upper switch are microstrip transmission lines; and
wherein a connection between the source of the lower switch and the gate driver coupled to the lower switch and a connection between the gate driver coupled to the lower switch and the gate of the field effect transistor of the lower switch are microstrip transmission lines.

7. The half bridge circuit of claim 1 wherein:
an alternating circuit source is connected to the upper switch and the lower switch;
a positive voltage source is connected to the capacitor and the upper switch; and
a negative voltage source is connected to the capacitor, the lower switch and the metal layer.

8. The half bridge circuit of claim 1 further comprising a multi-chip module for packaging the upper switch, the lower switch, and the power loop substrate.

9. A half bridge circuit comprising:
a substrate;
an upper switch on the substrate;
a lower switch on the substrate and coupled to the upper switch;
a power loop substrate;
a metal layer on the power loop substrate;
a capacitor coupled to the metal layer, the capacitor having a first end and a second end;
a first via coupled between the first end of the capacitor and the lower switch, the first via extending through the power loop substrate;
and
a second via coupled between the second end of the capacitor and the upper switch, the second via extending through the power loop substrate;
wherein the power loop substrate has a height and separates the metal layer from the upper switch and the lower switch by the height.

10. The half bridge circuit of claim 9 further comprising:
first and second metal posts coupled to the first and second vias for supporting the second substrate;
wherein switched current passes through the upper switch and the lower switch;
wherein return current passes through the first metal post, the second metal post, the capacitor and the metal layer; and
wherein a power loop inductance in a path for the switched current and the return current depends on a ratio of the height to a width of the metal layer.

11. The half bridge circuit of claim 9:
switched current passes through the upper switch and the lower switch; and
return current passes through the first metal post, the second metal post, the capacitor and the metal layer;
wherein a power loop inductance in a path for the switched current and the return current is proportional to a length between the first via and the second via; and
wherein the length between the first via and the second via is at least twice a width of the upper switch or the lower switch.

12. The half bridge circuit of claim 9 wherein:
the power loop substrate comprises BeO, AlN, $Al_2O_3$, direct-bonded cooper, or a flexible printed circuit board.

13. The half bridge circuit of claim 9 wherein:
the upper switch comprises a field effect transistor, having a gate coupled to a gate driver, a source, and a drain;
the lower switch comprises a field effect transistor, having a gate coupled to a gate driver, a source, and a drain;
wherein the source of the upper switch is connected to the drain of the lower switch;
wherein the source of the upper switch is coupled to the gate driver coupled to the upper switch; and
wherein the source of the lower switch is coupled to the gate driver coupled to the lower switch.

14. The half bridge circuit of claim 13:
wherein a connection between the source of the upper switch and the gate driver coupled to the upper switch and a connection between the gate driver coupled to the upper switch and the gate of the field effect transistor of the upper switch are microstrip transmission lines; and
wherein a connection between the source of the lower switch and the gate driver coupled to the lower switch and a connection between the gate driver coupled to the lower switch and the gate of the field effect transistor of the lower switch are microstrip transmission lines.

15. The half bridge circuit of claim 9 wherein:
an alternating circuit source is connected to the upper switch and the lower switch;
a positive voltage source is connected to the capacitor and the upper switch; and
a negative voltage source is connected to the capacitor, the lower switch and the metal layer.

16. The half bridge circuit of claim 9 further comprising:
a multi-chip module for packaging the upper switch, the lower switch, and the power loop substrate.

17. The half bridge circuit of claim 9 wherein the upper switch and the lower switch are integrated on an integrated circuit.

18. A half bridge circuit comprising:
a first substrate;
an upper switch on the first substrate;
a second substrate;
a lower switch on the second substrate, the lower switch facing the upper switch;
at least one post between the first substrate and the second substrate for supporting the first substrate over the second substrate;
the lower switch electrically coupled to the upper switch;
a capacitor coupled to the upper switch and coupled to the lower switch; and
a power loop substrate or a dielectric encapsulant between the upper switch and the lower switch;
wherein the power loop substrate has a height and separates the upper switch from the lower switch by the height; and
wherein the dielectric encapsulant supports a switched voltage to prevent breakdown.

19. The half bridge circuit of claim 18 wherein:
switched current passes through the upper switch and the lower switch; and
return current passes through the capacitor and the at least one post;
wherein a power loop inductance in a path for the switched current and the return current depends the height.

20. The half bridge circuit of claim 18 wherein:
the power loop substrate comprises BeO, AlN, $Al_2O_3$, direct-bonded cooper, or a flexible printed circuit board.

21. The half bridge circuit of claim 18 wherein:
the upper switch comprises a field effect transistor, having a gate coupled to a gate driver, a source, and a drain;
the lower switch comprises a field effect transistor, having a gate coupled to a gate driver, a source, and a drain;
wherein the source of the upper switch is connected to the drain of the lower switch;
wherein the source of the upper switch is coupled to the gate driver coupled to the upper switch; and
wherein the source of the lower switch is coupled to the gate driver coupled to the lower switch.

22. The half bridge circuit of claim 21:
wherein a connection between the source of the upper switch and the gate driver coupled to the upper switch and a connection between the gate driver coupled to the upper switch and the gate of the field effect transistor of the upper switch are microstrip transmission lines; and
wherein a connection between the source of the lower switch and the gate driver coupled to the lower switch and a connection between the gate driver coupled to the lower switch and the gate of the field effect transistor of the lower switch are microstrip transmission lines.

23. The half bridge circuit of claim 18 wherein:
an alternating circuit source is connected to the upper switch and the lower switch;
a positive voltage source is connected to the capacitor and the upper switch; and
a negative voltage source is connected to the capacitor, the lower switch.

24. The half bridge circuit of claim 18 further comprising:
a first heat sink connected to the first substrate; and
a second heat sink connected to the second substrate.

* * * * *